United States Patent [19]

Heagerty et al.

[11] 4,284,959
[45] Aug. 18, 1981

[54] FOLDED-CASCODE AMPLIFIER ARRANGEMENT WITH CASCODE LOAD MEANS

[75] Inventors: William F. Heagerty, Norristown, Pa.; Richard L. Pryor, Voorhees, N.J.

[73] Assignee: RCA Corporation, New York, N.Y.

[21] Appl. No.: 93,234

[22] Filed: Nov. 13, 1979

[51] Int. Cl.³ .......................... H03F 3/45; H03F 3/16
[52] U.S. Cl. .................................... 330/253; 330/257; 330/277; 330/288; 330/311
[58] Field of Search ............... 330/253, 257, 277, 288, 330/311

[56] References Cited

U.S. PATENT DOCUMENTS

| | | | |
|---|---|---|---|
| 3,953,807 | 4/1976 | Schade, Jr. | 330/277 |
| 4,045,747 | 8/1977 | Hsu | 330/288 X |
| 4,105,950 | 8/1978 | Dingwall | 331/57 |
| 4,152,663 | 5/1979 | Van de Sande | 330/253 |

FOREIGN PATENT DOCUMENTS 1425925 2/1976 United Kingdom ..................... 330/311

Primary Examiner—James B. Mullins
Attorney, Agent, or Firm—P. J. Rasmussen; P. M. Emanuel; Clement A. Berard, Jr.

[57] ABSTRACT

A folded-cascode amplifier arrangement includes first and second transistors of complementary conductivity type and a constant current generator for supplying quiescent current thereto. Signal current flowing in the first transistor is coupled to the second transistor through current steering at the interconnection between their main conduction paths. The load means for the second transistor includes a cascode-connected third transistor for supplying load current thereto, which third transistor substantially increases the resistance of the load for correspondingly increasing the voltage gain of the amplifier arrangement. The amplifier voltage gain transfer function exhibits a frequency response dominated by a single pole.

21 Claims, 3 Drawing Figures

FOLDED-CASCODE AMPLIFIER ARRANGEMENT WITH CASCODE LOAD MEANS

This invention relates generally to folded-cascode amplifiers and in particular to plural-stage amplifiers of the sort in which the load means therefor includes a cascode-connected transistor for substantially increasing its voltage gain.

BACKGROUND OF THE INVENTION

Cascode amplifiers conventionally comprise two transistors of like conductivity type having their main conduction paths serially connected. Where, for example, field-effect transistors are utilized, the first transistor operates as a common-source amplifier having its drain connected to the source of the second transistor which operates as a common-gate amplifier. Signals are applied to the gate of the first transistor while a reference potential is applied to the gate of the second transistor. Output signals are available at the drain of the second transistor. Such circuits are characterized by a voltage translation between their input and output terminals and by equality of the currents flowing in the several transistors. That is generally true whether the amplifier employs bipolar or field-effect transistors, or is configured in single-ended or differential configuration.

Voltage translation between input and output may be overcome by using a folded-cascode amplifier configuration. A first transistor operates effectively as a common-source amplifier having signals coupled to its gate. A second transistor of complementary conductivity type to the first transistor operates as a common-gate amplifier having a reference potential applied at its gate and having its source direct connected to the drain of the first transistor for receiving signal current therefrom. Quiescent operating current is supplied to the drain electrode of the first transistor and to the source electrode of the second transistor at their interconnection by, for example, a constant current generator. In such amplifiers, the respective main conduction paths of the two transistors are effectively in series for conducting signal currents, but are effectively in parallel for conducting quiescent current. Transistors $P_2$ and $N_7$ of FIG. 1, for example, are in folded-cascode configuration.

A further problem with known cascode amplifiers, whether of the conventional or folded variety, is the limitation of gain resulting from an inherent lack of current gain. Because the main conduction paths of the transistors are effectively in series for conducting signal current, the output current available from the second transistor is substantially equal to the signal current generated by the first transistor.

Cascode amplifiers are further voltage-gain limited by the resistance of the load connected to the output of the cascode stage. The latter problem is particularly acute in the case of field-effect transistor amplifiers wherein the output resistance of the FET is of low value as compared to the gate input resistance of subsequent FET circuitry.

In plural-stage amplifiers, such as a long-tailed pair amplifier stage having a conventional cascode amplifier stage in cascade connection therewith, as is useful in operational amplifiers, each stage ordinarily introduces a pole into the gain response as a function of frequency. These multiple poles cause the gain roll-off of the amplifier to exceed 6 db per octave so that the amplifier will not be suitable for use with large amounts of degenerative feedback (such as in a non-inverting unity follower configuration) without external, frequency-response shaping networks.

SUMMARY OF THE INVENTION

In a folded-cascode amplifier arrangement according to the present invention, including at least first and cascode transistors of complementary conductivity type to each other, signal currents flowing in the main conduction path of the first transistor responsive to an input signal are coupled to the circuit of the cascode transistor by current-steering. Load means to which the cascode transistor is coupled include a further transistor in cascode configuration whereby the output resistance of the load means is substantially increased. In another embodiment of the invention, the main-conduction path of the first transistor is coupled to a third transistor, which first and third transistors are connected in long-tailed-pair configuration.

IN THE DRAWINGS

FIG. 1 is a schematic diagram of an amplifier circuit embodying the present invention, and FIGS. 2 and 3 are circuit diagrams of differential-input amplifiers also embodying the invention.

DESCRIPTION OF THE PREFERRED EMBODIMENTS

Figure 1:
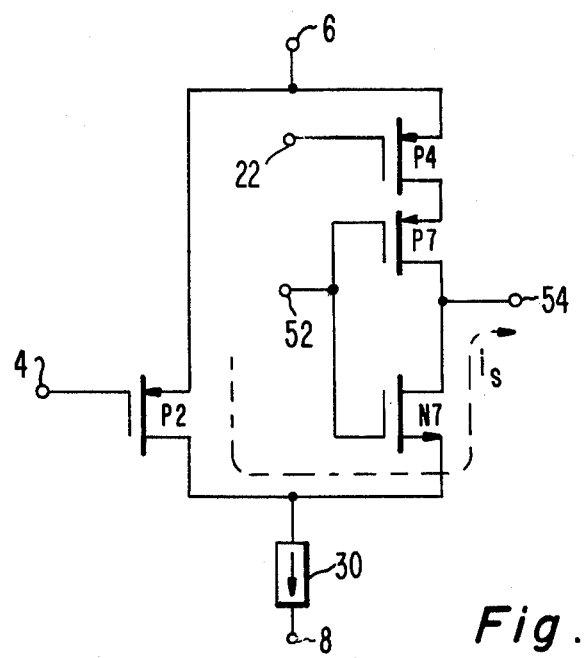

In the amplifier arrangement of FIG. 1, a folded-cascode configuration is formed by complementary transistors $P_2$ and $N_7$. P-channel field-effect transistor $P_2$, connected in common-source configuration, receives input signals from terminal 4 at its gate. N-channel field-effect transistor $N_7$, connected in common-gate configuration, has its gate connected to a point of reference potential 52 and receives signals at its source from the drain of $P_2$. Constant current generator 30 supplies quiescent drain current for $P_2$ and quiescent source current for $N_7$ from relatively negative voltage supply terminal 8.

Load means for transistor $N_7$ include serially connected P-channel FETs $P_4$ and $P_7$ for coupling the drain of $N_7$ to relatively positive supply terminal 6. FET $P_4$ receives a potential from node 22 which conditions it for conducting a load current in its source-to-drain conduction path. Cascode connected transistor $P_7$ receives a control signal, for example, a reference potential, from node 52 as its gate whereby it functions as a common-gate amplifier receiving the load current from $P_4$ at its source and supplying that load current as drain current to FET $N_7$ from its drain.

In operation, input signals applied to terminal 4 generate signal currents $i_s$ in the drain-to-source conduction path of transistor $P_2$. Current $i_s$ is coupled to output terminal 54 via the common-gate amplifier action of transistor $N_7$. The magnitude of signal current $i_s$ is less than the quiescent currents of FETs $P_2$ and $N_7$ so that the total current flows therein are of the normal polarity sense correponding to their normal forward current conduction conditions.

The voltage gain obtainable from such amplifiers is proportional to the load resistance at the drain of FET $N_7$. Cascode transistor $P_7$ increases the output resistance of $P_4$ by a factor of $1+g_m r_{ds7}$ so that the output resistance of $P_7$ is $$R_7 = r_{ds7} + r_{ds4}(1+g_m r_{ds7})$$

wherein:

$r_{ds4}$ is the drain-to-source conduction path resistance of $P_4$, $r_{ds7}$ is the drain-to-source conduction path resistance of $P_7$, and $g_m$ is the incremental ratio of drain current to gate-source voltae of $P_7$.

Thus, the voltage gain achieved is correspondingly increased by the factor $(1+g_m r_{ds})$ providing a substantial improvement in performance.

Such folded-cascode amplifiers are particularly advantageous in that they may be designed to have no voltage translation between the input and output terminals, they exhibit a gain-frequency response having a single, dominant pole, and they exhibit substantially increased voltage gain as a result of the cascode-connected load transistor described hereinabove. As a result of these advantages, improved performance is obtained from simplified circuits whereby cost is reduced and reliability is increased.

Figure 2:
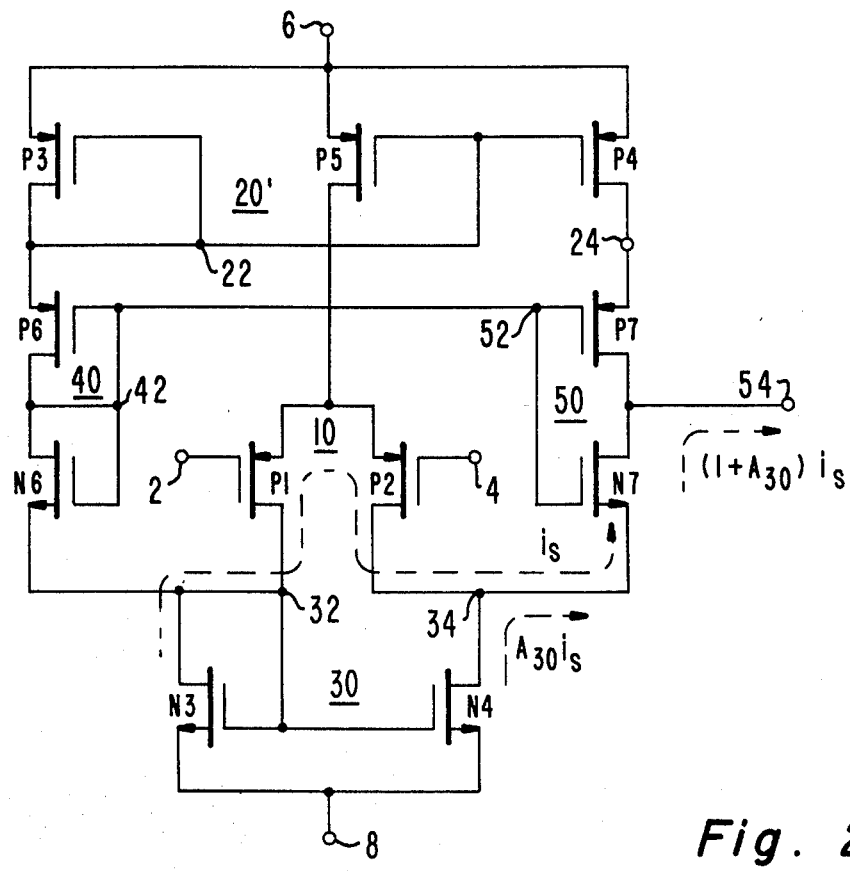

In the differential-input amplifier arrangement of FIG. 2, P-channel FET transistors $P_1$ and $P_2$ of long-tailed-pair (LTP) 10 receive input signals from terminals 2 and 4, respectively and tail current from transistor $P_5$ of constant current generator 20'.

The drains of FETs $P_1$ and $P_2$ connect respectively to the input and output circuits of current mirror amplifier 30 wherein diode-connected FET $N_3$ receives input current at node 32 and output transistor $N_4$ supplies proportional output current to node 34. The sources of FETs $N_3$ and $N_4$ connect in common and to relatively negative supply terminal 8. N-channel FET $N_7$, connected in common-gate amplifier configuration, receives signal current from node 34 at its source, reference potential from node 52 at its gate, and supplies output current to terminal 54 from its drain. $P_2$ and $N_7$ are thereby connected in folded-cascode configuration.

Current mirror amplifier 20' receives control current at node 22 to its input circuit formed by diode-connected transistor $P_3$. CMA 20' supplies tail current to LTP 10 from FET $P_5$ and source current to FET $P_7$ from FET $P_4$ via node 24. The sources of FETs $P_3$, $P_4$ and $P_5$ connect in common and to relatively positive supply terminal 6.

Transistor $P_7$, connected in common-gate configuration, receives reference potential from node 52 at its gate and conducts current from $P_4$ to output terminal 54. Interposing cascode transistor $P_7$ betweem CMA output transistor $P_4$ and terminal 54 causes the output resistance at 54 to be substantially increased providing a corresponding increase in the voltage gain as described hereinabove for FIG. 1.

Bias generating network 40, including series connected transistors $P_6$ and $N_6$, generates a substantially constant current responsive to the potentials at nodes 22 and 32. That bias current is supplied to the input circuits of current mirror amplifiers 20' and 30. Reference potential at node 42 is generated by voltage division across the respective drain-to-source paths of FETs $P_6$ and $N_6$. Bias network 40, as shown in FIG. 2, includes complementary transistors of conductivity types corresponding to those of cascode-connected output transistors $P_7$ and $N_7$. Such bias networks are susceptible for matching and temperature tracking with output amplifier 50.

In operation, input signals applied between terminals 2 and 4 generate signal currents $i_s$ flowing in the source-drain conduction paths of transistors $P_1$ and $P_2$. CMA 30 couples signal current $i_s$ from $P_1$ to node 34 as signal currents $A_{30} i_s$ where it reinforces the signal current $i_s$ from $P_2$. That reinforced signal current is coupled from node 34 to output terminal 54 via cascode-connected transistor $N_7$. If the current gain of CMA 30 is $A_{30}$, then the signal current supplied to terminal 54 by transistor $N_7$ will be substantially $(1+A_{30})$ times the signal current $i_s$ in LTP 10. The output current available at terminal 54 is thereby substantially greater than the signal current flowing in FET $P_2$ and the overall amplifier voltage gain is correspondingly increased.

Because coupling between LTP 10 and folded-cascode output amplifier 50 is effected by current steering at node 34, the principal pole in the transfer function of the overall amplifier will be contributed by $P_1$ and $P_2$ of LTP 10. Although the amplifier includes a plurality of stages, its voltage-gain transfer function is dominated by that single, simple pole. The voltage gain is substantially increased by the current reinforcement at node 34 due to CMA 30 and by the high drain output resistance of cascode transistor $P_7$ substantially increasing the load resistance for transistor $N_7$.

The usable common-mode input voltage range for the circuit of FIG. 2 extends from the potential at relatively negative supply terminal 8 to within a few volts (typically 1.5–2) of the potential at relatively positive supply terminal 6.

The circuit of FIG. 2 provides all the advantages of the circuit of FIG. 1 including increased volage gain as a result of the increased output resistance provided by FET $P_7$ and, in addition, provides a differential input configuration operable over a wide range of common-mode input voltages. Such amplifiers are particularly advantageous because the symmetrical configuration and complete absence of resistors permits compact, economical, and efficient constructions thereof in integrated circuit form.

Figure 3:
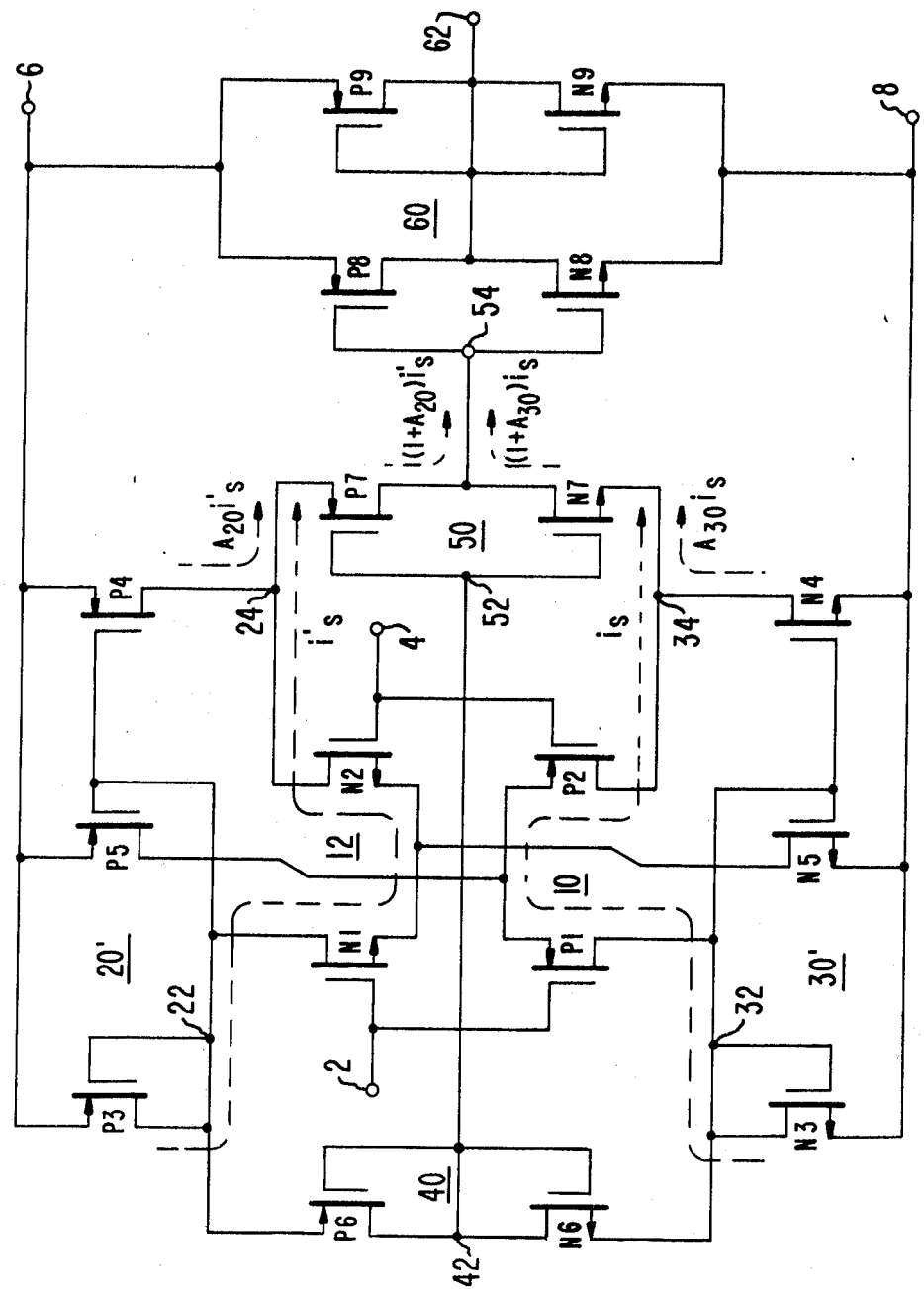

In the arrangement of FIG. 3, long-tailed-pair 10, current mirror amplifier 20', bias network 40, and complementary cascode output amplifier 50 operate substantially as described for FIG. 2.

Long-tailed-pair 12, including transistors $N_1$ and $N_2$ of opposite conductivity type to the transistors in LTP 10, also receives intput signal from terminals 2 and 4. The drain electrodes of FETs $N_1$ and $N_2$ connect to the input and output circuits respectively of CMA 20'. LTP 12 extends the common-mode input voltage range of the amplifier for potentials up to and including that at supply terminal 6, and provides a further increase in the available current at output 54.

CMA 30' is similar to CMA 30 except for the addition of further output transistor $N_5$ for supplying tail current to LTP 12.

Alternative arrangements of bias network 40 may include, for example, complementary transistors $N_6$ and $P_6$ wherein $N_6$ is connected proximately to relatively positive supply 6 and transistor $P_6$ is connected proximately to relatively negative supply terminal 8. Further alternative embodiments of bias network 40 might include arrangements employing transistors of like conductivity type to each other. Such alternatives are more difficult to match with transistors $N_7$ and $P_7$ of amplifier 50 than is the preferred embodiment shown in FIGS. 2 and 3.

In operation, input signals supplied between terminals 2 and 4 generate corresponding signal currents $i_s$ and $i_s'$ in long-tailed-pairs 10 and 12 respectively. Signal current $i_s$ from LTP 10 is reinforced at node 34 by current $A_{30} i_s$ from CMA 30' and is coupled by common-gate transistor $N_7$ to output 54. Thus, FETs $P_2$ and $N_7$ operate as a folded-cascode configuration. Similarly, signal current $i_s'$ from LTP 12 is reinforced at node 24 by current $A_{20}i_s$ from CMA 20' and is coupled to output 54 by common-gate transistor $P_7$. FETs $N_2$ and $P_7$ also operate as a folded-cascode configuration.

Output current contributions at terminal 54 derived from FETs $P_7$ and $N_7$ are in such polarity relationship that further reinforcement occurs. Therefore, if the current gain factors of CMA's 20' and 30' are $A_{20}$ and $A_{30}$, respectively, the signal current in $P_7$ will be substantially $(1+A_{20})$ times signal current $i_s'$ of LTP 12, the signal current in $N_7$ will be substantially $(1+A_{30})$ times signal current $i_s$ of LTP 10, and the signal current available at output terminal 54 will substantially equal $(1+A_{20}) i_s' + (1+A_{30}) i_s$. For example, if $A_{20}=A_{30}=1$ and long-tailed pairs 10 and 12 are nominally matched ($i_s=i_s'$), then the output signal current is 4 $i_s$.

The gain of the amplifier of FIG. 3 is enhanced, in addition to enhancement from the current reinforcement described hereinabove, by the complementary common-gate amplifier actions of transistors $P_7$ and $N_7$. Those transistors substantially increase the output resistance at terminal 54 as compared to the output resistances of $N_2$, $P_4$ and $P_2$, $N_4$, respectively, so that the respective load resistances for $P_7$ and $N_7$ are correspondingly substantially increased. In fact, the increased voltage gain attributable thereto is particularly advantageous in a field-effect transistor embodiment of the invention wherein the increase of voltage gain may be several orders of magnitude. Such increased resistance at output terminal 54 is particularly effective when a high input resistance amplifier such as amplifier 60 is used as a buffer between relatively high resistance output terminal 54 and relatively lower resistance output terminal 62.

Amplifier 60 is of the type described in U.S. Pat. No. 3,946,327 entitled "Amplifier Employing Complementary Field-Effect Transistors", issued to S. T. Hsu on Mar. 23, 1976.

The amplifier of FIG. 3 provides all the advantages of the circuits of FIGS. 1 and 2, and, in addition, is operable over a wider range of common-mode input voltages, including the potentials at supply terminals 6 and 8.

While the foregoing describes several embodiments of Applicants' invention, further embodiments would be evident to one skilled in the art of design when armed with the teaching of this disclosure. For example, each of the above-described circuits may be constructed employing bipolar transistors in any of the particular functions within the amplifier, for example, in LTP 10 or CMA 20 or CM 30 and so forth.

What is claimed is:

1. An amplifier arrangement comprising:
    a folded-cascode configuration including first and second transistors of complementary conductivity type, each having a main conduction path;
    constant current generating means coupled for supplying quiescent current to said folded-cascode configuration;
    means for applying an input signal to said first transistor for causing signal current flows in the main conduction paths of said first and second transistors; and
    load means to which said folded-cascode configuration is coupled including
    circuit means for supplying load current,
    a third transistor of like conductivity type to that of said first transistor, having its input electrode coupled for receiving a control signal, and having its main-conduction path coupled in series with said circuit means; and
    means for applying said control signal to condition said third transistor for conducting said load current to the output electrode of said folded-cascode configuration substantially unaffected by said input signal.

2. The amplifier arrangement according to claim 1 wherein said control signal is a reference potential and wherein the main-conduction path of said circuit third transistor is coupled between said means for supplying load current and the output electrode of said folded-cascode configuration.

3. The amplifier arrangement according to claim 2 wherein said circuit means for supplying load current includes:
    a fourth transistor of like conductivity type to that of said first transistor, having its main conduction path coupled serially with the main conduction path of said third transistor for supplying said load current thereto; and
    means for applying a potential to the input electrode of said fourth transistor for establishing conduction of said load current therein.

4. The amplifier arrangement according to claim 2 wherein said circuit means for supplying load current comprises:
    current mirror amplifying means having input circuit means, and having output circuit means coupled serially with said third transistor for supplying said load current thereto.

5. The amplifier arrangement according to claim 4 wherein said constant current generating means comprises:
    further current mirror amplifying means having input circuit means, and having output circuit means for supplyng said quiescent current to said folded-cascode configuration.

6. An amplifier arrangement as set forth in claim 5 further comprising:
    bias generating means having first and second connections for generating a current flow therebetween;
    means for coupling the current flow through said first connection to the input circuit of said current mirror amplifying means;
    means for coupling the current flow through said second connection to the input circuit of said further current mirror amplifying means; and
    means included within said bias generating means for supplying said reference potential, which reference potential is between and in substantially fixed relationship to the potentials at said first and second connections.

7. An amplifier arrangement as set forth in claim 6 wherein said bias generating means comprises:
    fifth and sixth transistors, each having a common electrode and each having its input electrode connected to its output electrode;
    means for connecting one of the output and common electrodes of said fifth transistor to one of the output and common electrodes of said sixth transistor for supplying said reference potential therefrom;
    means for connecting the other of the output and common electrodes of said fifth transistor to said first connection, and for connecting the other of the output and common electrodes of said sixth transistor to said second connection; and wherein said fifth and sixth transistors are of predetermined conductivity types so that they are poled for normal conduction responsive to the potentials at said first and second connections.

8. An amplifier arrangement according to any of claims 2 through 7 further comprising:

a seventh transistor of like conductivity type to that of said first transistor; and means for connecting said first and seventh transistors in long-tailed-pair configuration including means for supplying a tail current thereto.

9. An amplifier arrangement according to claim 8 wherein said circuit means for supplying load current includes a further output for supplying said tail current.

10. An amplifier arrangement comprising:

a first folded-cascode configuration including first and second transistors of complementary conductivity type;

a second folded-cascode configuration including third and fourth transistors of complementary conductivity type to that of said first and second transistors, respectively;

a fifth transistor of like conductivity type to that of said first transistor, said first and fifth transistors being connected in a first long-tailed-pair configuration including means for supplying tail current thereto;

a sixth transistor of like conductivity type to that of said third transistor, said third and sixth transistors being connected in a second long-tailed-pair configuration including means for supplying tail current thereto;

means for applying input signals between a common connection of the respective input electrodes of said first and third transistors and a common connection of the respective input electrodes of said fifth and sixth transistors;

means for applying a reference potential to a common connection of the input electrodes of said second and fourth transistors;

means for connecting the respective output electrodes of said second and fourth transistors for supplying output signals therefrom;

first and second means coupled to the main-conduction paths of said second and fourth transistors, respectively, for supplying respective quiescent currents thereto.

11. The amplifier arrangement of claim 10 wherein said means for supplying tail current to said first long-tailed-pair configuration includes first current mirror amplifying means having input circuit means and having at least first output circuit means, which first output circuit means supplies tail current to said first long-tailed-pair configuration; and said means for supplying tail current to said second long-tailed-pair configuration includes second current mirror amplifying means having input circuit means and having at least first output circuit means, which first output circuit means supplies tail current to said second long-tailed-pair configuration.

12. The amplifier arrangement according to claim 11 wherein said first and second means for supplying quiescent current to said second and fourth transistors respectively comprise second output circuit means of said second and first current mirror amplifying means, respectively.

13. An amplifier arrangement as set forth in either of preceding claims 11 or 12 further comprising:

bias generating means having first and second connections for generating a current flow therebetween;

means for coupling the current flow through said first connection to the input circuit of said first current mirror amplifying means;

means for coupling the current flow through said second connection to the input circuit of said second current mirror amplifying means; and means included within said bias generating means for supplying said reference potential, which reference potential is between and in substantially fixed relationship to the potentials at said first and second connections.

14. An amplifier arrangement as set forth in claim 13 wherein said bias generating means comprises:

seventh and eighth transistors, each having a common electrode and each having its input electrode connected to its output electrode;

means for connecting one of the output and common electrodes of said seventh transistor to one of the output and common electrodes of said eighth transistor for supplying said reference potential therefrom;

means for connecting the other of the output and common electrodes of said seventh transistor to said first connection, and for connecting the other of the output and common electrodes of said eighth transistor to said second connection; and wherein said seventh and eighth transistors are of predetermined conductivity types so that they are poled for normal conduction responsive to the potentials at said first and second connections.

15. An amplifier arrangement comprising:

first and second transistors of complementary conductivity types, each having respective output and common electrodes and a respective main conduction path therebetween, and each having a respective input electrode, the output electrode of said first transistor and the common electrode of said second transistor connecting to a common node;

means for applying an input signal to the input electrode of said first transistor to cause a signal current flow in the main conduction path thereof;

means for applying a reference signal to the input electrode of said second transistor;

constant current generating means coupled to said common node for supplying quiescent current thereto; and load means for supplying a load current, to which the main conduction path of said second transistor is coupled, including a third transistor having output and common electrodes and a main conduction path therebetween, and having an input electrode for receiving a first control signal for establishing a load current flow in its main conduction path; and a fourth transistor of like conductivity type to that of said first transistor, having input and output electrodes and a main conduction path therebetween serially coupled with the main conduction path of said third transistor, and having an input electrode for receiving a second control signal for conditioning said fourth transistor to conduct said load current.

16. The amplifier arrangement of claim 15 wherein the output electrode of said second transistor connects to the output electrode of said fourth transistor, and wherein said second control signal is responsive to said reference signal.

17. The amplifier arrangement of claim 15 wherein said constant current generating means supplies said quiescent current responsive to a third control signal received at an input connection thereof; said arrangement further including
bias generating means connected between the input electrode of said third transistor and the input connection of said constant current generating means for generating said first and third control signals, respectively.

18. The amplifier arrangement of claim 17 wherein said third transistor is included in an output circuit of a first current mirror amplifying means, having an input circuit coupled to the input electrode of said third transistor for receiving said first control signal.

19. The amplifier of claim 17 or 18 wherein said bias generating means comprises:
fifth and sixth transistors, each having a common electrode and each having its input electrode connected to its output electrode;
means for connecting one of the output and common electrodes of said fifth transistor to one of the output and common electrodes of said sixth transistor for supplying said reference and second control signals therefrom;
means for connecting the other of the output and common electrodes of said fifth transistor to a first connection at the input electrode of said third transistor, and for connecting the other of the output and common electrodes of said sixth transistor to a second connection at the input connection of said constant current generating means; and
wherein said fifth and sixth transistors are of predetermined conductivity types so that they are poled for normal conduction responsive to the potentials at said first and second connections.

20. An amplifier arrangement according to claim 15, 16, 17 or 18 further comprising:
a seventh transistor of like conductivity type to that of said first transistor; and
means for connecting said first and seventh transistors in long-tailed-pair configuration including means for supplying a tail current thereto.

21. An amplifier arrangement according to claim 20 wherein said load means includes a further transistor for supplying said tail current.

* * * * *

UNITED STATES PATENT AND TRADEMARK OFFICE
CERTIFICATE OF CORRECTION

PATENT NO. : 4,284,959
DATED : August 18, 1981
INVENTOR(S) : W. F. Heagerty et al.

It is certified that error appears in the above—identified patent and that said Letters Patent is hereby corrected as shown below:

Column 3, Line 7     "voltae" should be -- voltage -- ;

Column 4, Line 28    "volage" should be -- voltage -- ;

Column 4, Line 43    "intput" should be -- input -- ;

Column 6, Line 13    "circuit" should be deleted; and

Column 6, Line 14    insert -- circuit -- after "said".

Signed and Sealed this

Twenty-third Day of February 1982

[SEAL]

Attest:

GERALD J. MOSSINGHOFF

Attesting Officer      Commissioner of Patents and Trademarks